United States Patent
Wallner et al.

(10) Patent No.: US 7,587,655 B2
(45) Date of Patent: Sep. 8, 2009

(54) METHOD OF TRANSFERRING SIGNALS BETWEEN A MEMORY DEVICE AND A MEMORY CONTROLLER

(75) Inventors: Paul Wallner, Prien (DE); Andre Schaefer, München (DE); Thomas Hein, München (DE); Peter Gregorius, München (DE)

(73) Assignee: Infineon Technologies AG, Munich (DE)

( * ) Notice: Subject to any disclaimer, the term of this patent is extended or adjusted under 35 U.S.C. 154(b) by 560 days.

(21) Appl. No.: 11/259,376

(22) Filed: Oct. 26, 2005

(65) Prior Publication Data

US 2007/0091711 A1   Apr. 26, 2007

(51) Int. Cl.
G11C 29/00   (2006.01)
(52) U.S. Cl. .................. 714/763; 714/718; 714/742
(58) Field of Classification Search ............. 714/763, 714/718, 742; 713/600; 711/103, 167; 365/233; 71/763, 718, 742
See application file for complete search history.

(56) References Cited

U.S. PATENT DOCUMENTS

| | | | | |
|---|---|---|---|---|
| 6,119,245 | A * | 9/2000 | Hiratsuka | 714/7 |
| 6,882,568 | B2 * | 4/2005 | Shiota et al. | 365/185.08 |
| 7,039,782 | B2 * | 5/2006 | Garrett et al. | 711/167 |
| 7,152,138 | B2 * | 12/2006 | Spencer et al. | 711/103 |
| 7,206,233 | B2 * | 4/2007 | Shiota et al. | 365/189.04 |
| 7,243,254 | B1 * | 7/2007 | Kuroodi et al. | 713/600 |
| 2003/0070037 | A1 | 4/2003 | Manning | |
| 2005/0033910 | A1 | 2/2005 | Sommer | |

FOREIGN PATENT DOCUMENTS

| | | |
|---|---|---|
| DE | 103 29 395 A1 | 2/2005 |
| EP | 1069512 | 1/2001 |
| KR | 1020000070999 | 11/2000 |
| KR | 1020010029924 | 4/2001 |

OTHER PUBLICATIONS

Jedec Standard, Double Data Rate (DDR) SDRAM Specification, JESD79, Jun. 2000, Release 1, p. 13.
English Translation of Korean Patent Office Action dated Apr. 23, 2008, for counterpart Korean patent application.

* cited by examiner

*Primary Examiner*—Scott T Baderman
*Assistant Examiner*—Fritz Alphonse
(74) *Attorney, Agent, or Firm*—Patterson & Sheridan, L.L.P.

(57) ABSTRACT

Method and apparatus for communication (e.g., transmitting and/or receiving) command, address and data signals from a memory device to a memory controller or vice versa. The data signals are transferred with a first rate and command signals and/or address signals are transferred with a second rate lower than a first rate. Additionally or alternatively a command sequence code identifying a command sequence from a predefined group of command sequences is transferred with the first or with the second rate.

19 Claims, 5 Drawing Sheets

METHOD OF TRANSFERRING SIGNALS BETWEEN A MEMORY DEVICE AND A MEMORY CONTROLLER

BACKGROUND OF THE INVENTION

1. Field of the Invention

The present invention refers to a method of transferring command, address and data signals from a memory device to a memory controller or vice versa. Particularly, the present invention provides a more reliable transfer of command and address signals with a lower risk of bit errors.

2. Description of the Related Art

Conventionally, command, address and data signals are transferred between memory devices and a memory controller by a number of parallel lines. In response to growing computing capacities and growing amounts of information to be stored, the clock frequency and the data rate of this transfer are increased continuously. A number of fundamental problems now call for a completely new design or architecture of memory devices, memory controllers and their communication.

According to new concepts and technologies, command, address and data signals will be transferred in frames, each frame comprising command signals and/or address signals and/or data signals. Corrupted frames or frames which are recognized as faulty are transferred a second time. However, this reduces the performance of the channel between memory controller and memory device considerably.

SUMMARY OF THE INVENTION

Embodiments of the present invention provide a method of transferring command, address and data signals reliably between a memory device and a memory controller. Embodiments of the present invention further provide a memory device and a memory controller facilitating an improved reliable transfer of command, address and data signals. Some embodiments of the present invention improve the performance of a transfer between a memory controller and a memory device.

The present invention is a method of transferring command, address and data signals from a memory device to a memory controller or vice versa, the method comprising: transferring data signals with a first rate; and transferring command signals or address signals with a second rate, wherein the second rate is lower than the first rate.

Furthermore, the present invention is a method of transferring command signals from a memory device to a memory controller or vice versa, the method comprising: transferring a command sequence code, wherein the command sequence code is selected from a predefined group of command sequences codes, and wherein each command sequence code identifies a predefined sequence of commands.

Furthermore, the present invention is a microelectronic device for a data storage system, the microelectronic device comprising: an input/output section for transmitting and/or receiving command, address and data signals, wherein the input/output section is designated for transmitting and/or receiving data signals with a first rate and for transmitting and/or receiving command signals or address signals with a second rate, wherein the second rate is lower than the first rate, and wherein the microelectronic device is selected from the group comprising a memory device and a memory controller.

Furthermore, the present invention is a microelectronic device for a data storage system, the microelectronic device comprising: an input/output section for transmitting and/or receiving a command sequence code, wherein the command sequence code is selected from a predefined group of command sequence codes, wherein each command sequence code identifies a predefined sequence of commands, and wherein the microelectronic device is selected from the group comprising a memory device and a memory controller.

The present invention is based on the recognition that the bit error in a command or address signal causes more serious problems than in a data signal. This is due to the fact that command and address signals control the future operation of the memory device. Therefore, an error in a command or address signal may cause or result in a lengthy delay of the operation of the memory device.

The present invention is based on the idea to transfer command and address signals with a lower rate than data signals. Preferably the signals are transferred in frames. One frame contains a sub-frame for data signals and another sub-frame for command and/or address signals. These sub-frames are transferred with different rates.

Further, the present invention is based on the recognition that the commands provided by a memory controller and a memory device may be combined in a number of ways but only very few combinations are useful. The present invention is based on the idea to transfer a command sequence code out of a number of predefined command sequence codes instead of a sequence of command codes. Merely the small number of useful combinations of commands are encoded. Hence the number of command sequence codes is considerably smaller than the total number of theoretically possible command sequences and the number of bits of the command sequence code is considerably smaller than the number of bits necessary for the identification of each single command in the sequence. This reduction of bits may be used to improve the performance of the communication and/or for an improvement of its reliability or security. For this purpose each bit may be transferred twice and/or the command sequence code may be transferred with a lower bit-rate and/or an error-correction code is transferred for each command sequence code.

According to a further aspect of the present invention a method is provided for transferring command, address and data signals from a memory device to a memory controller or vice versa, the method comprising: transferring command or address signals with a higher degree of reliability than data signals. In one embodiment, this higher degree of reliability is achieved by a lower rate or by transferring each bit of the command or address signal twice or by transferring an error correction code. Further, it is an idea of the present invention to provide a memory controller or a memory device with an input/output section designed for participating in or performing this method.

According to one aspect of the present invention the reliability of transfer of signals between a memory controller and a memory device is increased without impairing the performance. In some embodiments this improvement is achieved without increasing the number of parallel lines and without considerably increasing the manufacturing costs of the memory controller and the memory device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit of other equally effective embodiments.

DETAILED DESCRIPTION OF THE PREFERRED EMBODIMENT

Figure 1:
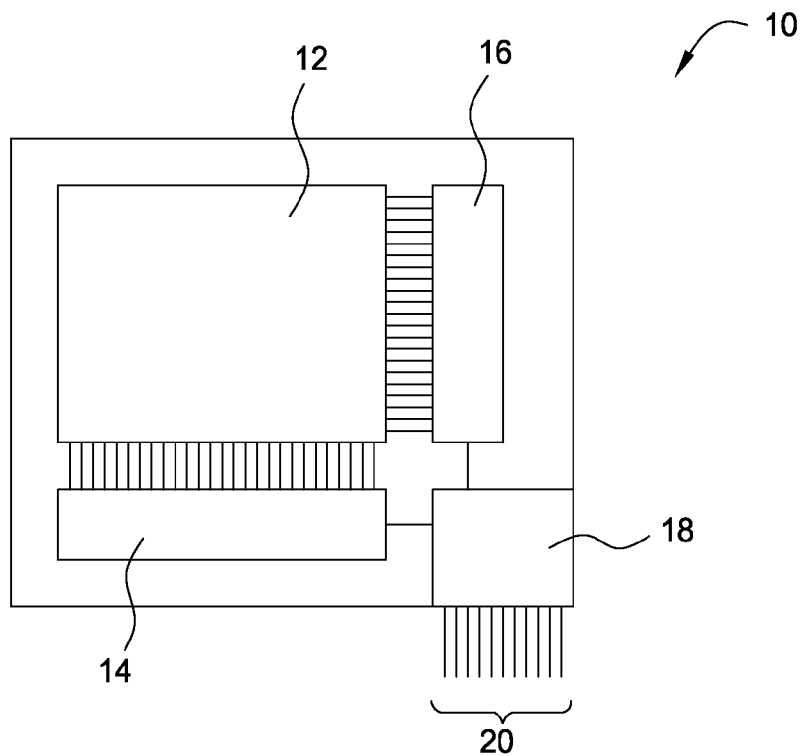
FIG. 1 is a schematic representation of a memory device according to an embodiment of the present invention.

FIG. 1 is a schematic representation of a memory device 10 according to the present invention. The memory device 10 comprises an array 12 of memory cells, a column address decoder 14 and a row address decoder 16. The column and row address decoders 14, 16 are connected to an input/output section 18 for transmitting and receiving command address and data signals via lines 20. The input/output section 18 is involved in the communication between the memory device 10 and a memory controller (described below with respect to FIG. 2). FIG. 1 is a simplified representation of the memory device 10. Merely some of its elements and functional blocks are displayed.

The input/output section 18 is designed for receiving and transmitting data signals with a first rate and command and/or address signals with a second rate lower than the first rate. Additionally or alternatively the input/output section 18 is designed for receiving and/or transmitting command sequence codes identifying predefined sequences of commands and for controlling the memory device 10 according to the command sequences identified by the command sequence codes. The operation of the input/output section 18 will be described in more detail below with reference to FIGS. 3 to 8.

Figure 2:
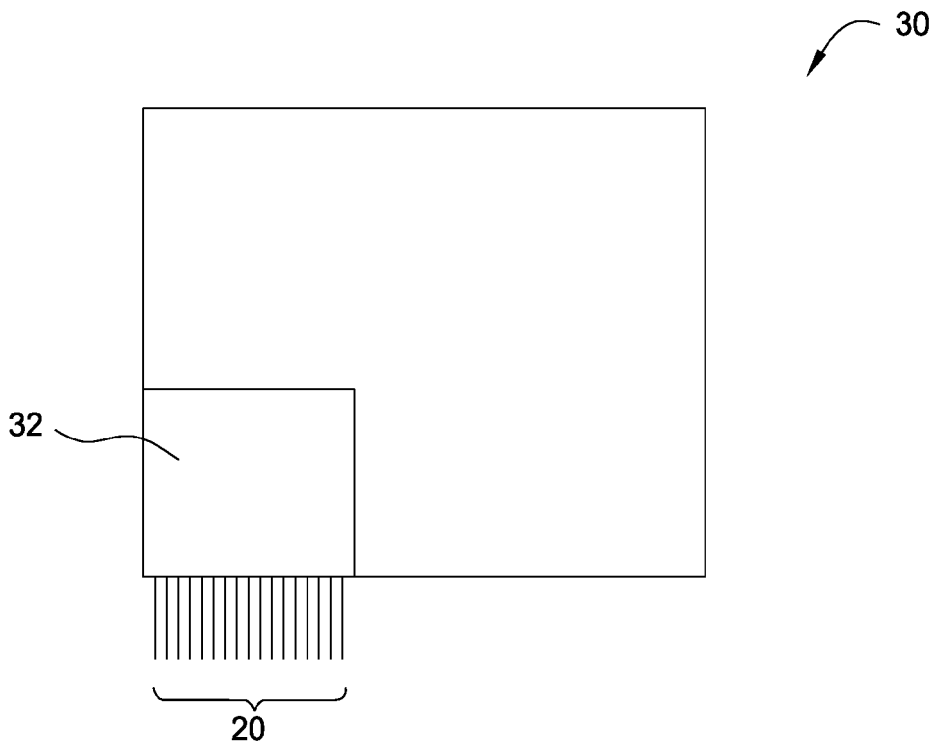
FIG. 2 is a schematic representation of a memory controller according to an embodiment of the present invention.

FIG. 2 is a schematic representation of a memory controller 30 with an input/output section 32. Further elements and components of the memory controller 30 are not necessary for an understanding of the present invention and hence are not displayed in FIG. 2. The input/output section 32 of the memory controller 30 is connected to one or several memory devices as displayed in FIG. 1 via a number of lines 20. The memory controller 30 controls the writing or storing of data in the array 12 of memory cells of the memory device 10 and the reading of data from the array 12 of memory cells of the memory device 10. For this purpose, the input/output section 32 of the memory controller 30 transmits and receives command, address and data signals via the lines 20.

The input/output section 32 of the memory controller 30 is designed for transmitting and receiving data signals with a first rate and command and/or address signals with a second rate lower than the first rate. Alternatively or additionally the input/output section 32 is designed for transmitting and/or receiving command sequence codes identifying sequences of commands. The operation of the input/output section 32 of the memory controller 30 will be described in more detail below with reference to FIGS. 3 to 8.

Figure 3:
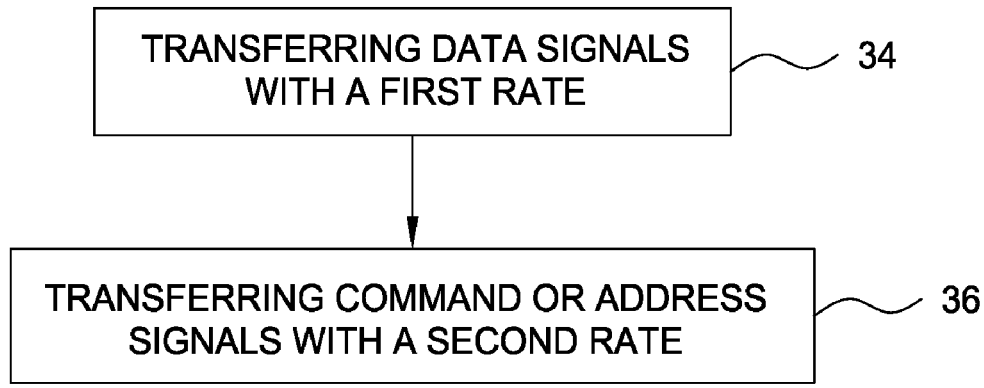
FIG. 3 is a schematic flowchart of a method according to an embodiment of the present invention.

FIG. 3 is a schematic flowchart of a method according to an embodiment of the present invention. In a first step 34 data signals are transferred with a first rate and in a second step 36 command and/or address signals are transferred with a second rate. The second rate is lower than the first rate. In one embodiment, the second rate is half the first rate. This method of transferring with two different rates may be applied to the transfer from the memory controller 30 to the memory device 10 as well as to the transfer from the memory device 10 to the memory controller 30.

In one embodiment command, address and data signals are transferred in frames. Each frame contains separate sub-frames for data signals and for command and/or address signals. A sub-frame containing data signals is transferred with the first rate and a sub-frame containing command and/or address signals is transferred with the second rate.

Both in case of a transfer in frames and sub-frames and in case of a transfer without the organisation in frames and sub-frames, the chronological order of the first and second steps 34, 36 can be as displayed in FIG. 3 or the other way round.

Figure 4:
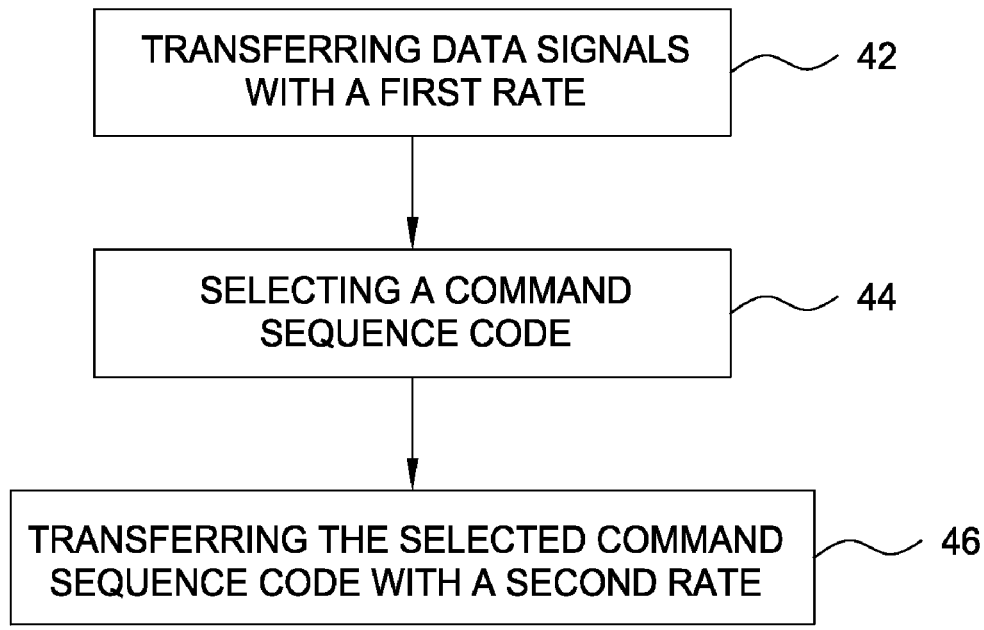
FIG. 4 is a schematic flowchart of a method according to another embodiment of the present invention.

FIG. 4 is a schematic flowchart of a method according to another embodiment of the present invention. Again, this method refers to the transfer of signals from a memory controller 30 to a memory device 10 as well as to a transfer of signals from a memory device 10 to a memory controller 30.

In a first step 42 data signals are transferred with a first rate. In a second step 44 a command sequence code is selected. This command sequence code identifies one of a predefined number of sequences of commands. Preferably, this number of predefined command sequences is smaller or much smaller than the total number of all the different sequences of commands which can theoretically be combined. Rather, the predefined group of command sequences merely comprises the useful command sequences. In a third step 46 the selected command sequence code is transferred with a second rate.

Similar to the method described above with reference to FIG. 3, the chronological order of the steps 42, 44, 46 of the method displayed in FIG. 4 can be modified. While a command sequence code needs to be selected (step 44) before it is transferred (step 46) data signals may be transferred (step 42) before or after the command sequence code. Further, similar to the method described above with reference to FIG. 3, the method described with reference to FIG. 4 may be applied to a transfer in frames as well as to a transfer without frames. In case of a frame-based transfer, preferably data signals are transferred in one sub-frame and a command sequence code is transferred in another sub-frame.

Figure 5:
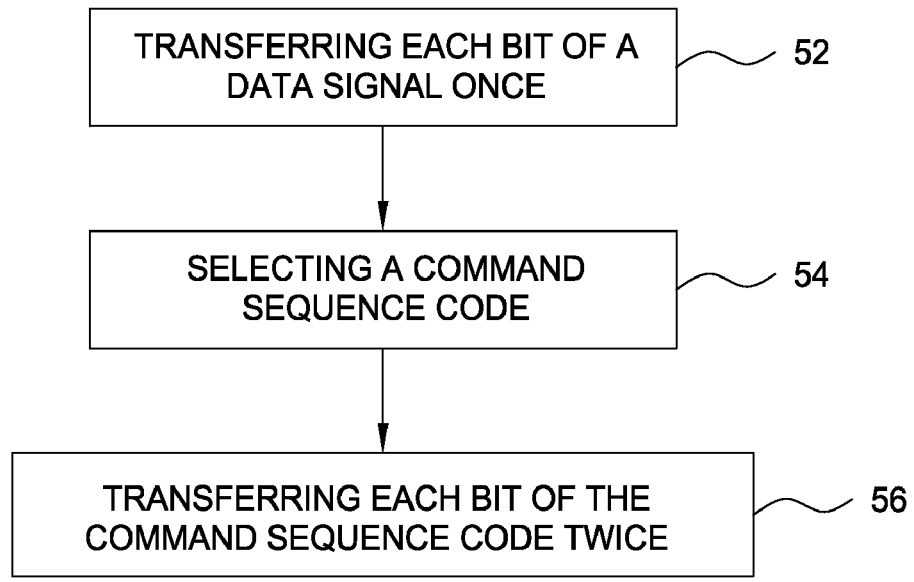
FIG. 5 is a schematic flowchart of a method according to another embodiment of the present invention.

FIG. 5 is a schematic flowchart of a method according to another embodiment of the present invention. Again, this method may be applied to the communication from a memory controller 30 to a memory device 10 as well as to a communication from the memory device 10 to the memory controller 30.

In a first step 52 each bit of a data signal is transferred once. In a second step 54 a command sequence code is selected. Similar to the method described above with reference to FIG. 4, each command sequence code identifies one predefined command sequence out of a predefined group of command sequences. This predefined group of command sequences includes merely the small number of useful command sequences but does not include all the other command sequences which can theoretically be composed but are not useful.

In a third step 56 each bit of the selected command sequence code is transferred twice. The command sequence code includes considerably less bits than a sequence of codes identifying the single commands. Therefore, even when each bit of a command sequence code is transferred twice, the transfer takes less time or the same time or only slightly more time than the conventional transfer of the sequence of command codes.

Again, a command sequence code needs to be selected (step 54) before it is transferred (step 56) but the data signal may be transferred (step 52) before or after the command sequence code is transferred (step 56). Again, the method displayed in FIG. 5 can be applied to a transfer protocol providing frames as well as to a non-frame transfer protocol.

Figure 6:
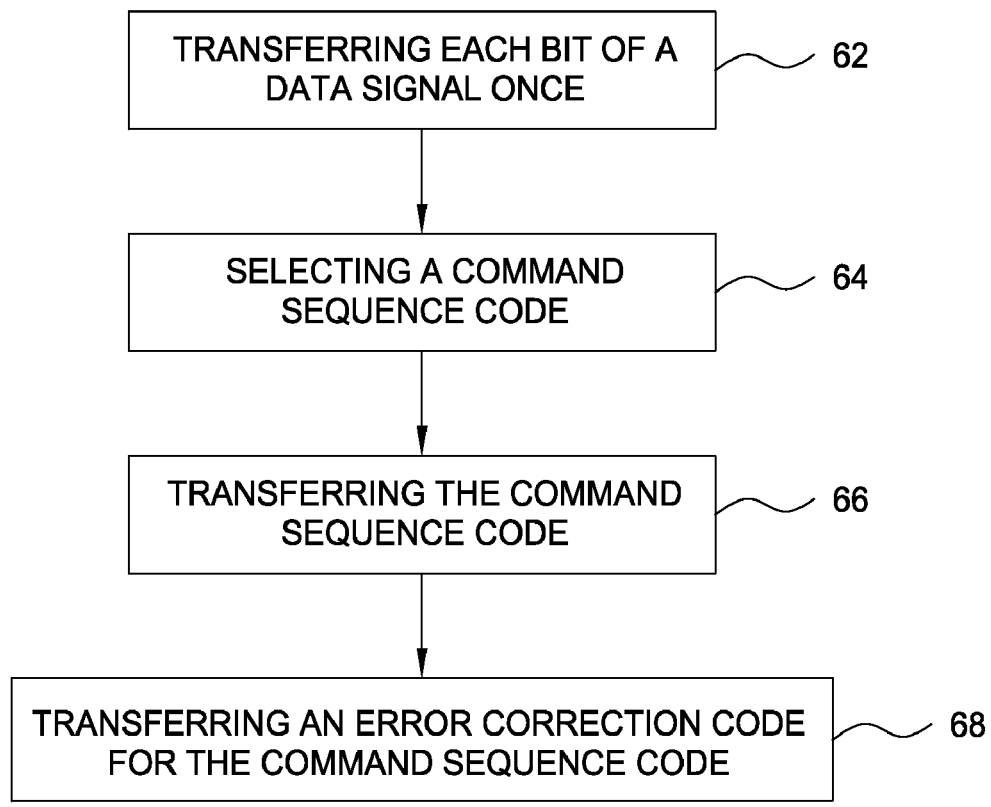
FIG. 6 is a schematic flowchart of a method according to another embodiment of the present invention.

FIG. 6 is a schematic flowchart of a method according to another embodiment of the present invention. The first and second steps 62, 64 are similar to the first and second steps 52, 54 of the method described above with reference to FIG. 5. In a third step 66 the command sequence code selected in the second step 64 is transferred. In a fourth step 68 an error correction code (ECC) for the command sequence code is transferred. Similar to the embodiment described above with reference to FIG. 5 and for the same reasons, in spite of the additional transfer of an error correction code, the transfer described with reference to FIG. 6 is faster or at least not slower or only slightly slower than a conventional communication.

Similar to the methods described above with reference to FIGS. 3 to 5, the chronological order of the steps 62, 64, 66, 68 may be modified. While a command sequence code needs to be selected (step 64) before it is transferred (step 66) and before an error correction code for the command sequence code is transferred (step 68), data signals may be transferred (step 62) before or after the selected command sequence code is transferred (step 66) and before or after an error correction code for the selected command sequence code is transferred (step 68) and the command sequence may be transferred (step 66) before or after the error correction code for the command sequence code is transferred (step 68).

Further, similar to the methods described above with reference to FIGS. 3 to 5, the method may be applied to a frame-based communication with data signals and command sequence code signals being transferred in different sub-frames as well as to a communication without frames.

Figure 7:
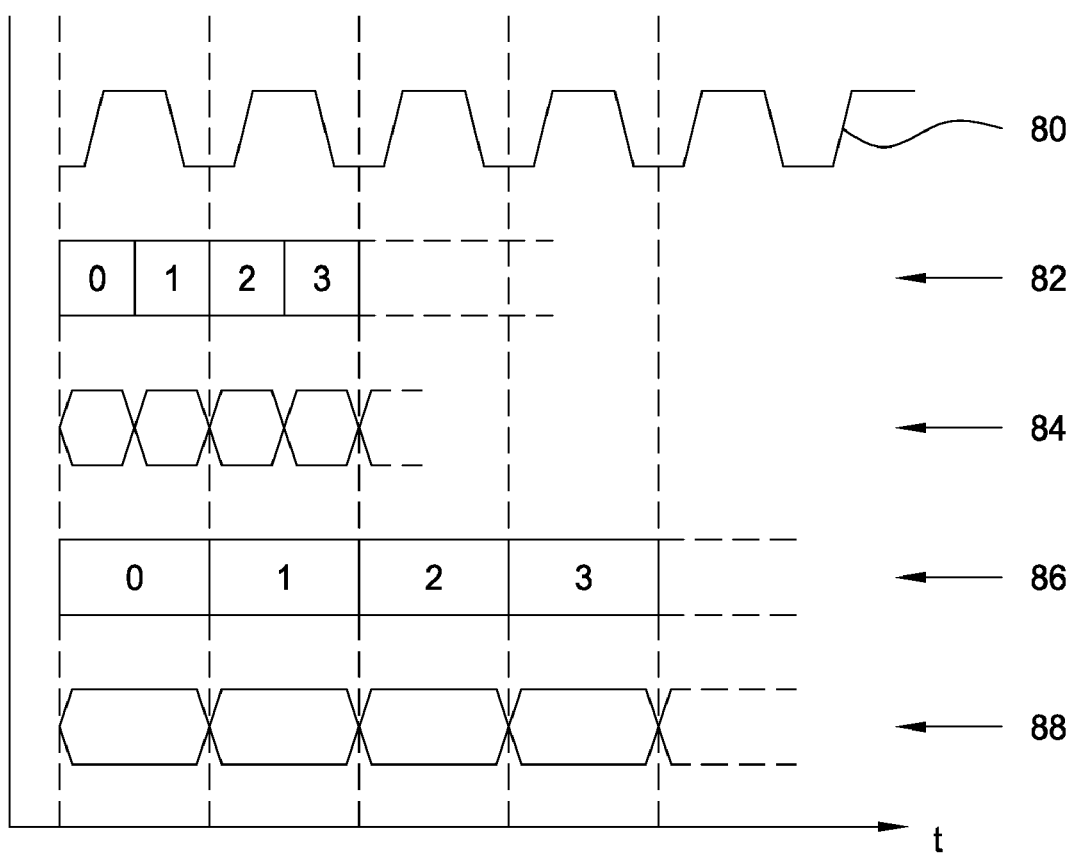
FIG. 7 is a schematic diagram describing the timing of signals in a conventional communication between a memory controller and a memory device and according to an embodiment of the present invention.

FIG. 7 is a schematic diagram displaying the timing of signals according to conventional methods and according to methods according to the present invention. The time t is assigned to the abscissa.

The first graph or trace 80 represents a clock signal provided to both the memory controller and the memory device. Conventionally at each rising or falling edge of a clock signal one bit (bit 0, bit 1, bit 2, bit 3; see the second line 82) is transferred. The resulting signal eyes are schematically represented, see the third line 84.

In the embodiments described above with reference to FIGS. 3 and 4, command and/or address signals or a command sequence code, respectively, are transferred with a second rate lower than a first rate applied to data signals. Preferably, this second rate is half the first rate. Preferably, this is achieved as displayed in the fourth and fifth lines 86, 88 of FIG. 7; one bit (bit 0, bit 1, bit 2, bit 3) is transferred at each cycle of the clock signal, each cycle comprising a rising edge and a falling edge of the clock signal (fourth line 86). The resulting signal eyes are displayed in the fifth line 88.

The reduced rate results in reduced sensitivity to noise or electromagnetic interference.

Figure 8:
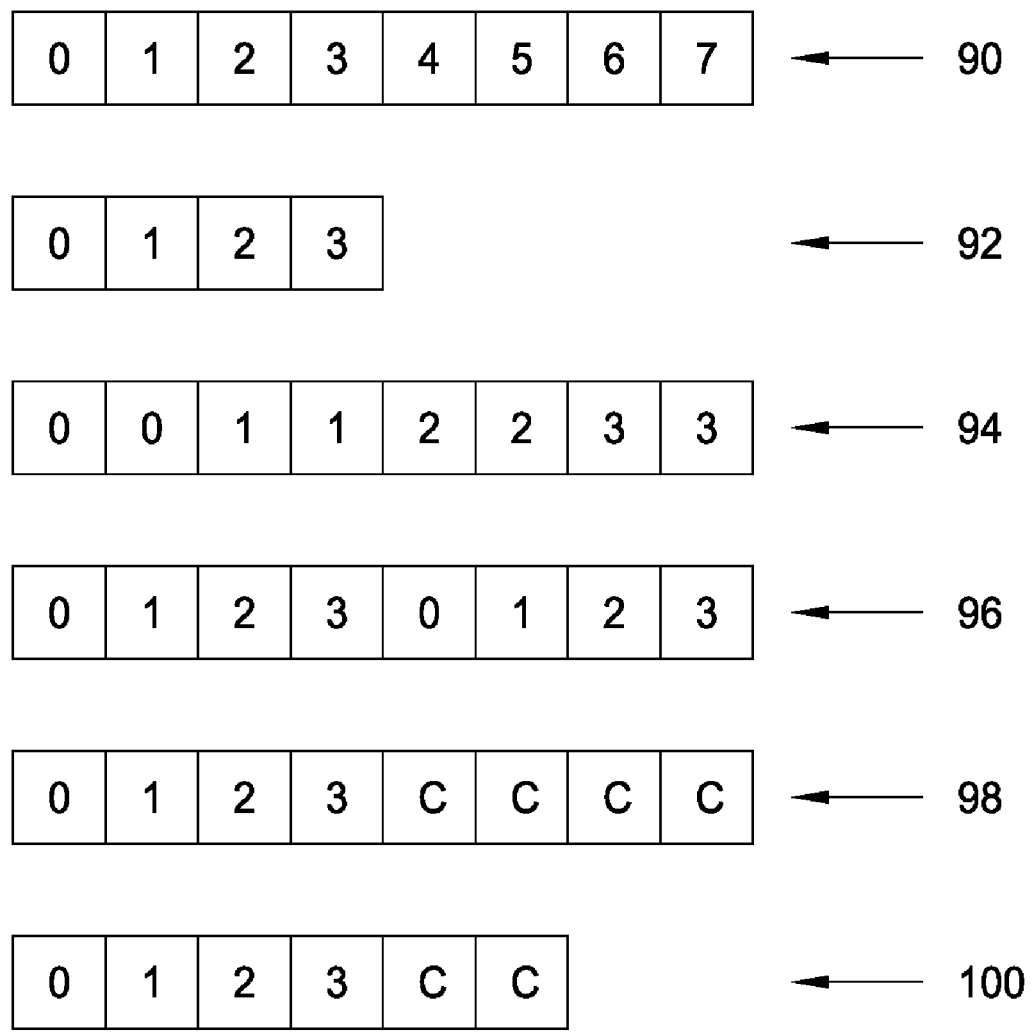
FIG. 8 is a schematic representation of bits transferred between a memory controller and a memory device according to the state of the art and according to several embodiments of the present invention.

FIG. 8 is a schematic representation of the bits which are to be transferred conventionally or according to the present invention. This example refers to thirteen different commands and to command sequences comprising two commands. Conventionally (first line 90) four bits (bit 0, bit 1, bit 2, bit 3) identify the first command in the command sequence and four bits (bit 4, bit 5, bit 6, bit 7) identify the second command in the sequence. Theoretically these thirteen commands can be combined in a total number of 169 different two-command sequences.

However, only a small number of command sequences is useful. If for example 16 different command sequences are useful, four bits (bit 0, bit 1, bit 2, bit 3; second line 92) are necessary to identify each of these predefines useful command sequences. The transfer of four bits (second line 92) instead of eight bits (first line 90) means a considerably improved performance. However, it is preferred to improve the reliability of the transfer instead. This will be described below with reference to the third through sixth lines 94, 96, 98, 100 of FIG. 8.

As already described with reference to FIG. 5, the transfer of command and/or address signals can be made more reliable and less sensitive to noise or electromagnetic interference by transferring each bit twice. Preferably either each bit is repeated immediately as displayed in the third line 94, or the whole sequence of bits is repeated as displayed in the fourth line 96 of the FIG. 8.

As already described above with reference to FIG. 6, an error correction code may be transferred for each command sequence code (fifth line 98 and sixth 100 of FIG. 8). The bits C of the error correction code are transferred before or after the bits 0, 1, 2, 3 of the command sequence code. The error correction code may facilitate the reconstruction of the corrupted command sequence code (fifth line 98) or merely the identification of a command sequence code as corrupted (sixth line 100).

Some of the embodiments have been described above with reference to command signals only. However, some of these embodiments may be applied to address signals instead or additionally. In particular the transfer of address signals with a second rate (cf. the method described above with reference to FIG. 3) and transferring each bit of an address signal twice (cf. the third and fourth lines 94, 96 of FIG. 8) and transferring an error correction code for each address signal (cf. the fifth and sixth lines 98, 100 of FIG. 8) are advantageous and improve the reliability of the transfer.

As far as frames and sub-frames are used in the above described embodiments, it is obvious that the size of the frame and the size of each sub-frame may be predefined as well as variable.

While the foregoing is directed to embodiments of the present invention, other and further embodiments of the invention may be devised without departing from the basic scope thereof, and the scope thereof is determined by the claims that follow.

What is claimed is:

1. A method of transferring signals between a memory device and a memory controller, the method comprising:
   configuring the memory device to transfer data signals to the memory controller at a first rate; and
   configuring the memory device to transfer at least one of command signals and address signals to the memory controller at a second rate, wherein the second rate is slower than the first rate, wherein the command, address and data signals are transferred in frames; and wherein a frame contains a first subframe containing data signals and a second subframe containing the at least one of command and address signals.

2. The method of claim 1, wherein the second rate is half the first rate.

3. The method of claim 1, wherein the memory device transfers a predefined command signal to the memory controller at the second rate and wherein the predefined command signal identifies a command sequence code selected from a predefined group of command sequence codes, each command sequence code identifying a predefined sequence of commands.

4. The method of claim 3, wherein a number of command sequence codes in the predefined group of command sequence codes is less than a total number of possible command sequences capable of being transferred between the memory device and the memory controller.

5. The method of claim 3, wherein transferring the selected command sequence code comprises transferring an error correction code.

6. The method of claim 1, wherein:
within the first subframe, a data bit is transferred at each rising edge and each falling edge of a clock signal; and
within the second subframe, one command or address bit, respectively, is transferred at each cycle of the clock signal, each cycle of the clock signal comprising a rising edge and a falling edge of the clock signal.

7. The method of claim 1, wherein:
the second subframe comprises a command sequence code,
the command sequence code is selected from a predefined group of command sequence codes, and
each command sequence code identifies a predefined sequence of commands.

8. The method of claim 3, wherein transferring the selected command sequence code comprises transferring each bit of the command sequence code twice.

9. A microelectronic device for a data storage system, comprising:
an input/output section for communicating command signals, address signals and data signals,
wherein the input/output section is configured for communicating data signals at a first rate and for communicating at least one of the command signals and address signals at a second rate, wherein the second rate is slower than the first rate, and wherein the microelectronic device is selected from one of a memory device and a memory controller, wherein the input/output section is configured such that:
the input/output section transmits and/or receives the command, address and data signals in frames; and
the input/output section transmits and/or receives a frame containing a first subframe comprising data signals and a second subframe comprising at least one of the command and address signals.

10. The microelectronic device of claim 9, wherein the input/output section is configured such that the second rate is half the first rate.

11. The microelectronic device of claim 9, wherein
the input/output section is configured for transmitting and/or receiving a command sequence code selected from a predefined group of command sequence codes each identifying a predefined sequence of commands.

12. The microelectronic device of claim 11, wherein a number of command sequence codes comprised in the group of command sequence codes is less than a total number of possible command sequences capable of being communicated by the input/output section.

13. The microelectronic device of claim 9, wherein the input/output section is designed such that:
within the first subframe, the input/output section transfers one data bit at each rising and each falling edge of a clock signal; and
within the second subframe, the input/output section transfers one command or address bit, respectively, at each cycle of the clock signal, each cycle of the clock signal comprising a rising edge and a falling edge.

14. The microelectronic device of claim 9, wherein the second subframe comprises a command sequence code selected from a predefined group of command sequence codes each identifying a predefined sequence of commands.

15. The microelectronic device of claim 9, wherein the input/output section is configured for transmitting or receiving, respectively, each bit of the command sequence code twice.

16. The microelectronic device of claim 9, wherein the input/output section is configured for transmitting or receiving, respectively, an error correction code for each command sequence code.

17. A system, comprising the microelectronic device of claim 9 and a plurality of electrical components, the plurality of electrical components being at least one of structurally and functionally related.

18. The system of claim 17, wherein at least one of the plurality of electrical components is a memory controller.

19. A method of transferring signals between a memory device and a memory controller, the method comprising:
configuring the memory controller to transfer data signals to the memory device at a first rate; and
configuring the memory controller to transfer at least one of command signals and address signals to the memory device at a second rate, wherein the second rate is slower than the first rate, wherein the command, address and data signals are transferred in frames; and wherein a frame contains a first subframe containing data signals and a second subframe containing the at least one of command and address signals.

* * * * *